(12) United States Patent
Samuelson et al.

(10) Patent No.: US 8,691,011 B2
(45) Date of Patent: Apr. 8, 2014

(54) METHOD FOR METAL-FREE SYNTHESIS OF EPITAXIAL SEMICONDUCTOR NANOWIRES ON SI

(75) Inventors: Lars Samuelson, Malmö (SE); Thomas Mårtensson, Lund (SE); Werner Seifert, Sebnitz (DE); Anders Mikkelsen, Arlöv (SE); Bernhard Mandl, Pfarrkirchen (AT)

(73) Assignee: QuNano AB, Lund (SE)

( * ) Notice: Subject to any disclaimer, the term of this patent is extended or adjusted under 35 U.S.C. 154(b) by 594 days.

(21) Appl. No.: 12/224,822

(22) PCT Filed: Mar. 7, 2007

(86) PCT No.: PCT/SE2007/050131
§ 371 (c)(1),
(2), (4) Date: Apr. 1, 2009

(87) PCT Pub. No.: WO2007/102781
PCT Pub. Date: Sep. 13, 2007

(65) Prior Publication Data
US 2009/0301389 A1    Dec. 10, 2009

(30) Foreign Application Priority Data

Mar. 8, 2006  (SE) ..................................... 0600533
May 22, 2006  (SE) ..................................... 0601142

(51) Int. Cl.
*C30B 23/00*    (2006.01)
(52) U.S. Cl.
USPC .......................................................... 117/88

(58) Field of Classification Search
USPC .......................................................... 117/88
See application file for complete search history.

(56) References Cited

U.S. PATENT DOCUMENTS

| 4,341,605 | A  | * | 7/1982  | Solenberger et al. ......... 205/524 |
| 4,957,873 | A  | * | 9/1990  | Ojha et al. .................... 438/440 |
| 6,130,142 | A  |   | 10/2000 | Westwater et al. |
| 6,596,377 | B1 |   | 7/2003  | Hersee et al. |
| 6,693,021 | B1 |   | 2/2004  | Motoki et al. |
| 6,709,929 | B2 |   | 3/2004  | Zhang et al. |
| 7,303,631 | B2 |   | 12/2007 | Conley, Jr. et al. |
| 7,309,621 | B2 |   | 12/2007 | Conley, Jr. et al. |

(Continued)

FOREIGN PATENT DOCUMENTS

WO    2006060599 A2    12/2005
WO    2006025793 A1    3/2006

OTHER PUBLICATIONS

Mohan et al, "Controlled growth of highly uniform axial/radial direction-defined, individually addressable InP nano wire arrays", Nanotechnology, 16 (2005) 2903-2907.*

(Continued)

*Primary Examiner* — Bijay Saha
(74) *Attorney, Agent, or Firm* — The Marbury Law Group PLLC

(57) ABSTRACT

The present invention relates to epitaxial growth of nanowires on a substrate. In particular the invention relates to growth of nanowires on an Si-substrate without using Au as a catalyst. In the method according to the invention an oxide template is provided on a passivated surface of the substrate. The oxide template defines a plurality of nucleation onset positions for subsequent nanowire growth. According to one embodiment a thin organic film is used to form the oxide template.

6 Claims, 6 Drawing Sheets

(56) References Cited

U.S. PATENT DOCUMENTS

| | | |
|---|---|---|
| 7,335,908 B2 | 2/2008 | Samuelson et al. |
| 7,354,850 B2 | 4/2008 | Seifert et al. |
| 7,445,742 B2 | 11/2008 | Chen et al. |
| 2004/0262636 A1 | 12/2004 | Yang et al. |
| 2005/0011431 A1 | 1/2005 | Samuelson et al. |
| 2005/0161662 A1 | 7/2005 | Majumdar et al. |
| 2006/0073680 A1 | 4/2006 | Han et al. |
| 2006/0112466 A1 | 5/2006 | Den |
| 2006/0125056 A1 | 6/2006 | Samuelson et al. |
| 2006/0223211 A1 | 10/2006 | Mishra et al. |
| 2006/0292055 A1 | 12/2006 | Byeun et al. |
| 2006/0292312 A1* | 12/2006 | Kim et al. ............ 427/532 |
| 2007/0001220 A1 | 1/2007 | Tombler, Jr. et al. |
| 2007/0172183 A1 | 7/2007 | Wang |
| 2007/0257264 A1 | 11/2007 | Hersee et al. |
| 2007/0286945 A1 | 12/2007 | Lahnor et al. |
| 2008/0036038 A1 | 2/2008 | Hersee et al. |
| 2008/0149946 A1 | 6/2008 | Kim et al. |

OTHER PUBLICATIONS

Bertness et al, "Catalyst Free Growth of GaN Nano wires" J. Electronic Materials, 35, 4, 2006 576-580.*

Mohan et al, "Controlled growth of highly uniform axial/radial direction-defined, individually addressable InP nano wire arrays", Nanotechnology, 16 (2005) 2903-2907 (Mohan) as evidenced by Ojha et al. US 4,957,873.*

U.S. Appl. No. 12/308,249, filed Jan. 14, 2008, Seifert et al.

International Search Report and Written Opinion dated Jun. 13, 2007, in counterpart PCT/SE2007/050131, 8 pages.

Bertness et al., "Catalyst-Free Growth of GaN Nanowires," Journal of Electronic Materials, 2006, 35(4):576-580.

Dailey et al., "Vapor-liquid-solid growth of germanium nanostructures on silicon," Journal of Applied Physics, Dec. 15, 2004, 96(12):7556-7567.

Hersee et al., "The Controlled Growth of GaN Nanowires," Nano Letters, 2006, 6(8):1808-1811.

Kipshidze et al., "Controlled growth of GaN nanowires by pulsed metalorganic chemical vapor deposition," Applied Physics Letters, 2005, 86:033104-1 to 033104-3.

Liang et al., "Selective-area growth of indium nitride nanowires on gold-patterned Si(100) substrates," Applied Physics Letters, Jul. 1, 2002, 81(1):22-24.

Ma et al., "Small-Diameter Silicon Nanowire Surfaces," Science, Mar. 21, 2003, 299:1874-1877.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Pan et al., "Single-crystal growth of metallic nanowires with preferred orientation," Nanotechnology, 2005, 16:1559-1564.

Qian et al., "Core/Multishell Nanowire Heterostructures as Multicolor, High-Efficiency Light-Emitting Diodes," Nano Letters, 2005, 5(11):2287-2291.

Su et al., "Catalytic growth of group III-nitride nanowires and nanostructures by metalorganic chemical vapor deposition," Applied Physics Letters, 2005, 86:013105-1 to 013105-3.

European Patent Office, Extended Search Report, Application No. 07716104.0, issued May 28, 2013, 5pgs.

* cited by examiner

*Fig. 6a-b*

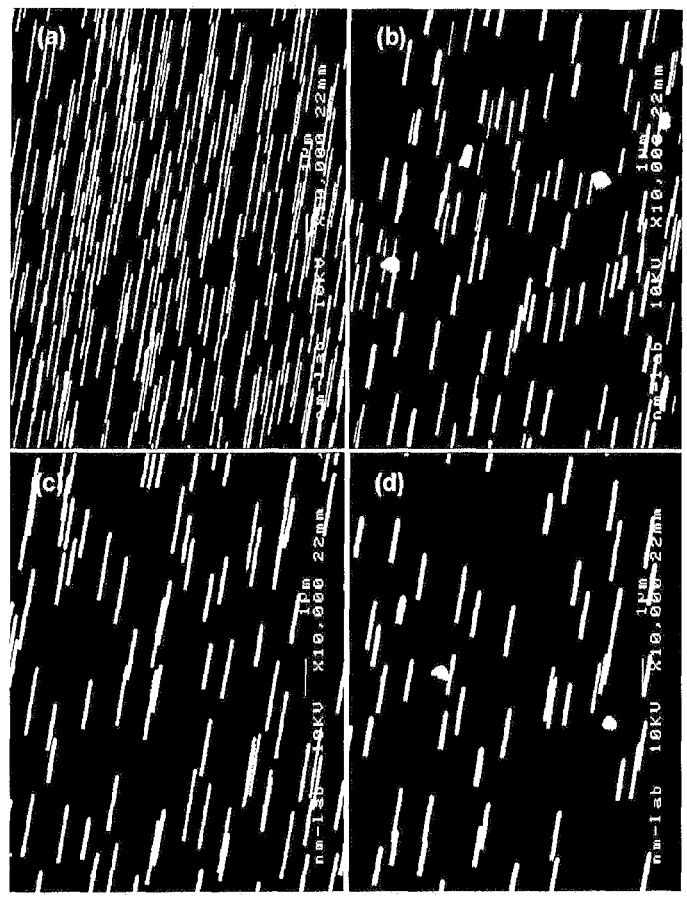
Fig. 7a-d
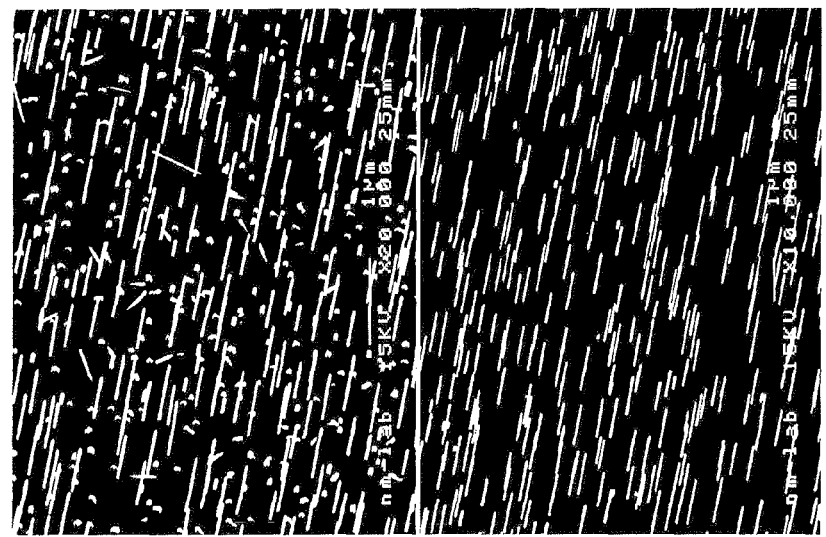
Fig. 8a-b

METHOD FOR METAL-FREE SYNTHESIS OF EPITAXIAL SEMICONDUCTOR NANOWIRES ON SI

CROSS-REFERENCE TO RELATED APPLICATIONS

This application is a National Stage application of PCT/SE2007/050131, filed Mar. 7, 2007, which claims priority from Swedish applications SE 0600533-4, filed Mar. 8, 2006, and SE 0601142-3, filed May 22, 2006.

FIELD OF THE INVENTION

The present invention relates to a method of growing III-V semiconductor nanowires on a silicon substrate. In particular the invention relates to a method of growing nanowires without using Au, or any other metal, as a catalyst.

BACKGROUND OF THE INVENTION

Over recent years the interest in semiconductor nanowires (NWs) has intensified. Nanowires are also referred to as nanowhiskers, nanorods and nanocolumns etc. For the purpose of this application the term nanowire is used for a nanostructure that include one-dimensional nanoelements, essentially in one-dimensional form, that are of nanometer dimensions in their width or diameter. Controlling the one-dimensional growth on the nanometer scale offers unique opportunities for combining materials, manipulating properties, both mechanical and electromagnetical, and to design novel devices.

For a large-scale impact of NW technology, a high level of compatibility with existing silicon processing will be essential. Advanced III-V heterostructure and high mobility NW components would then be available as an "add-on" technology for high speed electronics and photonics. However, as of today, the vast majority of reports on NW growth utilize the vapor-liquid solid (VLS) mechanism, see e.g. R. S. Wagner, In Whisker Technology, Levitt, A. P., Ed. Wiley: New York, 1970, and most commonly Au as catalyst material. It is well known that Au impurities in Si create deep levels acting as recombination centers degrading the electronic properties of the Si material. Thus, for compound nanowire technology to be compatible with silicon technology and processing, alternatives to Au need to be found.

Epitaxial growth of III-V semiconductors on Si presents several difficulties such as lattice mismatch, differences in crystal structure (III-Vs have a polar zincblende or wurtzite structure whereas Si has a covalent diamond structure), a large difference in thermal expansion coefficient and the formation of so called anti-phase domains. Much work has been done on planar growth of III-V materials on Si using different approaches attempting to grow device quality structures, see e.g. S. F. Fang et al., Gallium-Arsenide and Other Compound Semiconductors on Silicon. Journal of Applied Physics 68, R31-R58. (1990) for a review.

It is recognized that a III-V semiconductor NW grown out from an Si substrate would probably overcome several of the above mentioned problems, due to the small cross-section of the conjunction between the NW and the Si substrate. However, the known procedures for manufacturing NWs do, as described above, include Au-particles for catalyzing the growth process.

SUMMARY OF THE INVENTION

Obviously the prior art methods of producing nanowires or nanostructures of III-V semiconductors needs significant improvements in order to be compatible with the established silicon based production methods used by the semiconductor industry. In particular the need for gold as a growth promoting catalyst should preferably be eliminated.

The object of the present invention is to provide a method that overcomes the drawbacks of the prior art methods. This is achieved by the method as defined in claim 1.

The method according to the invention provides a nano-structured devices which comprises a nanowire epitaxially grown from a surface of a substrate. The method comprises the steps of:
- hydrogen termination of the surface of the substrate to provide a substrate with a temporarily passivated surface.
- providing an oxide template on the passivated surface of the substrate. The oxide template defines a plurality of nucleation onset positions for the subsequent nanowire growth;
- growing nanowires in the nucleation onset positions defined by the oxide template on the substrate surface.

The oxide template is according to one embodiment self-assembled or produced in a process wherein a self-assembled thin layer of another material is utilized in the formation of the oxide template.

According to one embodiment of the invention the step of providing an oxide template comprises a pre-treatment prior to the growth phase comprising the steps of:
- applying a thin organic film on the substrate surface; and
- providing a nucleation onset period, wherein the conditions as regards to time and environment are controlled so that a partial oxidation occurs on the substrate surface. The oxidation process is guided at least partly by the applied thin organic film or residues of the film giving a correlation between the structure of the oxide template and the thin organic film or the residues of the film.

According to another embodiment the step of providing an oxide template comprises:
- applying a thin layer of a volatile species to the substrate, the thin layer of a volatile species forming an oxide template; and
- providing, during the growth phase, conditions as regard to time, pressure and temperature ensuring that the nucleation of nanowires is guided by the oxide template.

Thanks to the method according to the invention Au or other materials recognized as hazardous by the silicon industry can be avoided as catalyst materials in the growth of nanowires or nanostructures. Si surfaces can be treated to produce epitaxially oriented compound nanowires using epitaxy growth systems. Such epitaxial NW can e.g. be used for high speed electronics and photonics.

Thanks to the invention it is possible to grow nanowires of III/V semiconductor materials without the use of metallic catalyst particles. This is of high importance in the aim of combining the nanostructure technology with the established silicon based production methods used by the semiconductor industry.

One advantage of the invention is that the steps of the method can be easily adapted to industrial batch processing.

A further advantage is that the method of growing nanowires according to the invention can be combined with modern nanolithography techniques.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 6*a-c* Illustrates the effect of the nucleation onset period, In (a) n-decane was spun and the sample directly transported to the growth apparatus, in (b) the sample spun with n-decane and stored in humid air for approx. 10 min and the graph of (c) illustrate the density of nanowires as a function of the exposure time to humid air;

FIG. 7*a-d* illustrates InAs nanowires grown according to the method of the invention using the organic compounds: a) allyl alcohol, b) n-decane, c) acetone, d) ethanol;

FIG. 8*a-b* illustrates the effect of the pre-heating according to one embodiment of the invention, (a) without pre-heating and (b) with pre-heating.

DETAILED DESCRIPTION

According to the present invention a general method is provided to produce epitaxial nanowires of III-V materials, without using Au-particles as catalyst. The method is described with InAs as the primary material in the Nanowires. However, also other semiconductor compounds, especially III-V compounds can be used in the same manner. InAs has one of the highest electron mobility within the family of III-V compounds and is therefore very interesting for electronic applications of nanowires. It has been shown that InAs nanowires can easily be contacted and gated. With inbuilt barriers (e.g. InP), the functionality of such structures in single electron transistors as described by C. Thelander et al., *Appl. Phys. Lett.* 2003, 83, (10), 2052, and functional devices such as resonant tunneling devices has been demonstrated. Moreover, InAs has a high potential to be used complementary in combination with Si for high speed electronics applications. For this purpose, however, nanowires grown Au-assisted impose severe restrictions due to the introduction of deep-level defects into Si.

Si is for most applications the preferred choice of substrate material, due to the electronic properties and not at least, to the well established methods of using Si in large scale production. Under the conditions used the nanowires grow in the <111> direction with an epitaxial relation to the substrate. For a Si(111) surface the nanowires are directed normal to the surface, for a Si(001) surface the nanowires form an angle of approximately 35 degrees with the surface etc. Since for most applications, nanowires normal to the surface is preferred, the method according to the invention is optimized, but not limited, for the use of a Si(111)-substrate. However, the method according to the invention, is applicable also to other substrates, for example substrates of III-V compounds could be of interest for some applications. Modifications of the method to accommodate for various substrates materials are obvious for the skilled in the art.

Figure 1:
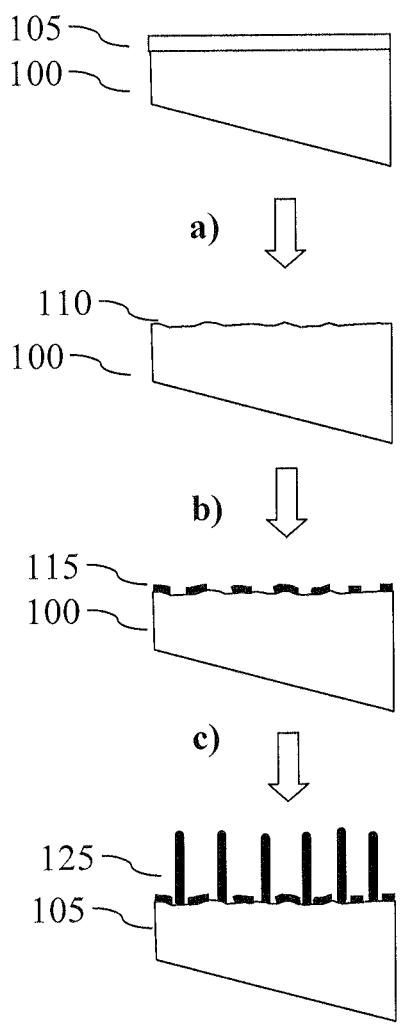
FIG. 1 is a schematic illustration of the steps according to the method of the invention.

According to the method of the present invention nanowire growth on the Si substrate is guided by an oxide template provided on the Si surface in a pre-treatment, prior to the growth process. The oxide template guides the nanowire nucleation by increasing the probability of nucleation in certain areas of the substrate. These areas of increased probability of nucleation will be referred to as nucleation onset positions. The method according to the invention, is schematically illustrated in FIG. 1 and comprises the basic steps of:

a): Hydrogen termination of the surface of the substrate 100, for example by etching in hydrofluoric acid, HF. The HF etching removes native oxides 105 from the surface of the Si(111) substrate 100 and provides a substrate with a temporarily passivated surface 110.

b): Providing an oxide template 115 on the passivated surface 110 of the substrate 100. The oxide template defining a plurality of nucleation onset positions for subsequent nanowire growth. The oxide template can be provided in different ways which will be described below.

c): Growth of nanowires, wherein epitaxially grown, vertically standing nanowires 125 are formed on the substrate surface on at least a part of the nucleation onset positions.

The oxide template can provide nucleation onset positions by the oxide forming localised patches of silicon oxide which subsequently acts as catalyst particles for the onset of nanowire growth. The composition in the localised patches is preferably and typically $SiO_x$, $x \approx 1$. Alternatively the oxide template forms a growth inhibiting mask, the mask typically being fully oxidised, $SiO_2$. Nucleation onset positions are provided as less oxidised, or non-oxidised, patches in the growth inhibiting mask. In this case the subsequent growth of nanowires would occur in the patches wherein the surface of the substrate is less oxidised. According to one embodiment the oxide template is self-assembled, i.e. the structure of the oxide template is primarily formed spontaneously. The term self-assembled oxide template should also be understood to include an oxide template wherein the self-assembled characteristics are provided in a process including that another substance, for example an organic compound, has a self-assembled structured that is at least partly transferred to the oxide template. The self-assembling process may be influenced by the environment, the temperature, the material in the substrate and the substrate surface etc. This embodiment will promote a subsequent growth of nanowires at random positions on the substrate surface. As an alternative, representing a another embodiment of the invention, the oxide template may be given a structure by patterning, for example using lithographic methods. According to this embodiment the growth of nanowires will be at pre-determined positions.

According to one embodiment of the invention the oxide template 115 is directly provided on the passivated substrate surface. The embodiment comprises a pre-treatment of applying a thin layer of a volatile species, for example and preferable $SiO_x$ ($x \approx 1$), on the substrate prior to the growth procedure. The thin layer of a volatile species forms the oxide template 115 either as a catalyst layer or as a growth inhibiting mask. The structure of the oxide template may be formed directly at the application of the thin layer, or alternatively, through a subsequent treatment of the thin layer, for example by highering the temperature. The basic steps of the method according to the invention is modified according to:

b') in a pre-treatment phase applying a thin layer of a volatile species to the substrate, the thin layer of a volatile species forming an oxide template 115.

c') during the growth phase provide conditions as regard to time, pressure and temperature, ensuring that the nucleation of nanowires is guided by the oxide template 115.

The oxide template may undergo changes during the growth phase, for example evaporate partly, or restructure due to the increased temperature. The method of the embodiment may be further refined by ensuring that the nucleation of nanowires take place prior to any significant re-structuring of the oxide template 115. Step c') then comprises:

c':1) providing a first condition wherein the source for the nanowire growth is turned on at a substrate temperature lower than a pre-determined temperature associated to the oxide template. The pre-determined temperature is chosen so that no significant re-structuring of the oxide template occurs in the time-frame of the step. The pre-determined temperature is typically lower than an optimized nanowire growth temperature, but high enough to facilitate an onset of the nucleation of nanowires.

c':2) providing a second condition wherein the temperature of the substrate is optimised for promoting the growth of the nanowires. The second temperature is typically higher than the first temperature. Due to that the nucleation have started in the previous step, changes to the oxide template will have low impact on the growth of the nanowires.

Figure 2:
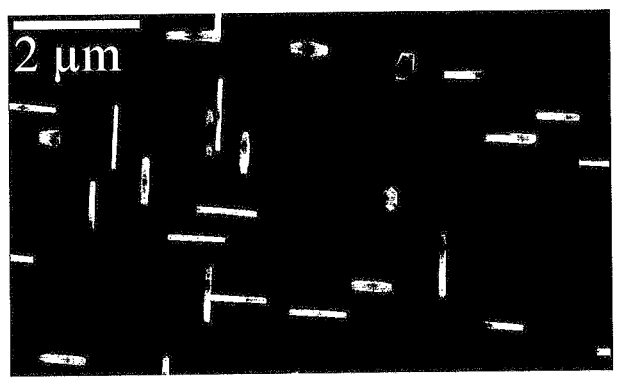
FIG. 2 illustrates the resulting nanowires grown on a Si(100) substrate using the method according to the invention.

An implementation example according to the embodiments utilizing a direct deposition of the oxide template may comprise the following process:

For wire-growth a low pressure metal organic vapor phase epitaxy (LP-MOVPE) was used at a pressure of 10 kPa, with trimethylindium (TMI), arsine ($AsH_3$), and phosphine ($PH_3$) as precursor materials, transported in a flow of 6000 ml/min of $H_2$ as carrier gas. For the precursors typical molar fractions of $2 \times 10^{-6}$ for TMI and $2 \times 10^{-4}$ for $AsH_3$ were used. For TMI, also higher molar fractions were tested, but had no significant effect on the growth rate. The molar fraction for $PH_3$ was varied in the range $(3.5\text{-}15) \times 10^{-3}$. As substrates epitaxy-ready III/V wafers and Si wafers were used. In case of Si substrates, the native oxide was removed by an HF dip, corresponding to step a). Before loading the substrates into the growth chamber, a thin $SiO_x$ layer was sublimated onto the surface, corresponding to step b). The substrates were then heated to the growth temperature between 520° C. and 680° C. in a $H_2$ atmosphere. As soon as the growth temperature was reached, the precursors were switched on simultaneously. The growth was stopped by switching off the TMI source, and the samples were cooled under $AsH_3$ flow, or for InAsP deposition, under additional $PH_3$ flow. Resulting nanowires grown on Si(100) are shown in FIG. 2.

Figure 3:
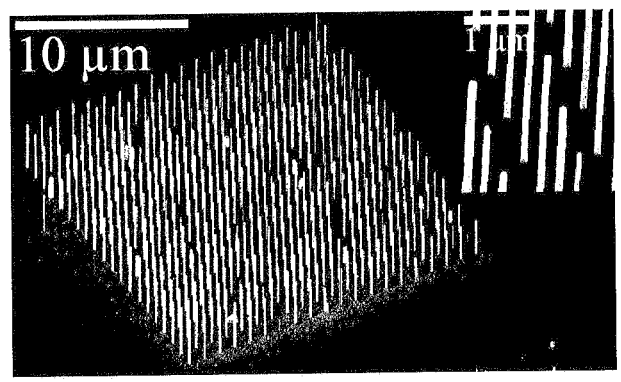
FIG. 3 illustrates the resulting nanowires grown using one embodiment of the method according to the invention.

According to another embodiment of the invention the use of an oxide template is combined with a patterning method, for example a lithographic method, to produce a defined pattern, for example an array or matrix of nanowires. The pattern can be prepared by conventional lithographic methods, for example electron beam lithography. In an implementation example of the second embodiment the pattern was prepared by spinning PMMA onto the InP(111)B substrates, and writing a regular array of dots using electron beam lithography. Si substrates are treated the same way. After developing the positive resist to open up apertures down to the substrate, the $SiO_x$ layer was deposited, and the remaining resist was removed in a lift-off process. To grow wires on such patterned $SiO_x$ films, the sources had to be activated already during the heating-up period at 510-520° C. Activating the sources later, i.e., at higher growth temperatures, leads to a loss of the pattern. This has most probably to do with the thermal stability of $SiO_x$, which evaporates markedly at temperatures above 500° C. Scanning tunneling microscopy investigations at temperatures of around 500° C. have shown that a 1.3 nm thick $SiO_x$ layer evaporates in time scales comparable to our growth times of several minutes. It should be noted that in our case the wires were not grown out of openings in the $SiO_x$-layer, but at the site where, after e-beam lithography and lift-off, islands of $SiO_x$ remain, the $SiO_x$ islands act as "catalysts" similar to Au particles in case of patterned growth in the InP(Au)/InP(111)B system as described in T. Mårtensson, et al. "Fabrication of individually seeded nanowire arrays by vapour-liquid-solid growth." *Nanotechnology* 14, 1255-1258. (2003). The result is shown in FIG. 3.

In one embodiment of the invention the oxide template 115 is provided by a controlled oxidation process. During the pre-treatment of the passivated Si substrate applying a thin organic film is applied to the passivated surface, for example allyl alcohol (2-propen-1-ol). Alternatively other organic materials such as acetone and n-decane can be used. The thin organic film should, at least at some part of the pre-treatment, be semi-permeable to substances that could affect the surface of the Si substrate. Suitable thin film thickness will be dependent on the organic compound used, on the time scale of the pre-treatment and the conditions wherein the pre-treatment is performed, as regards to for example humidity. Typical thin film thicknesses is in the range 10-200 Å. A subsequent part of the pre-treatment according to the embodiment of invention allows for forming of nucleation onset positions by localised alterations in the substrate surface or localised formations, or residues, on the substrate surface.

Figure 4:
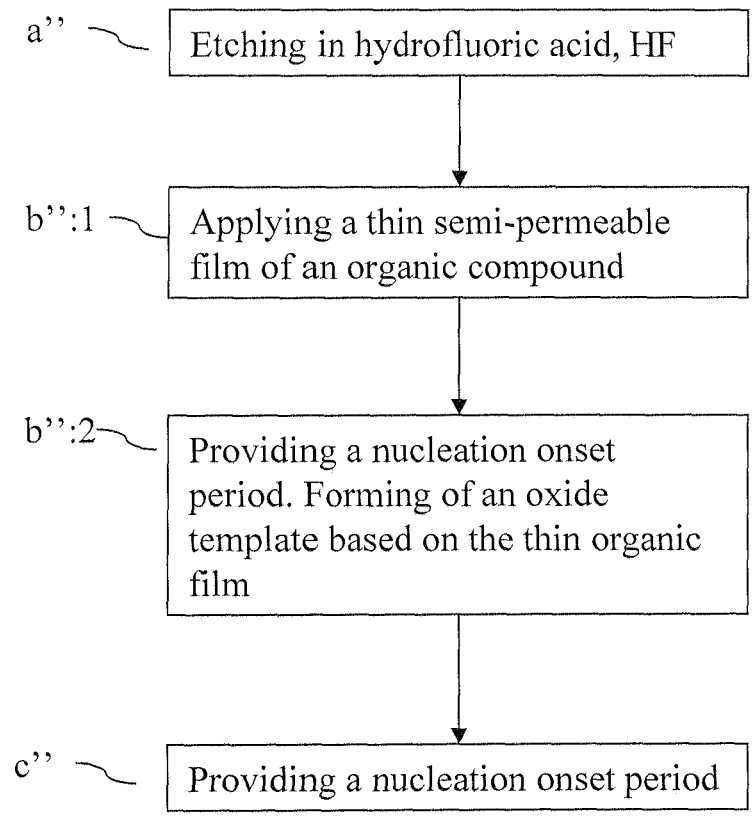
FIG. 4 is a flowchart over one embodiment of the method of the invention using a thin organic film in forming an oxide template.
Figure 5:
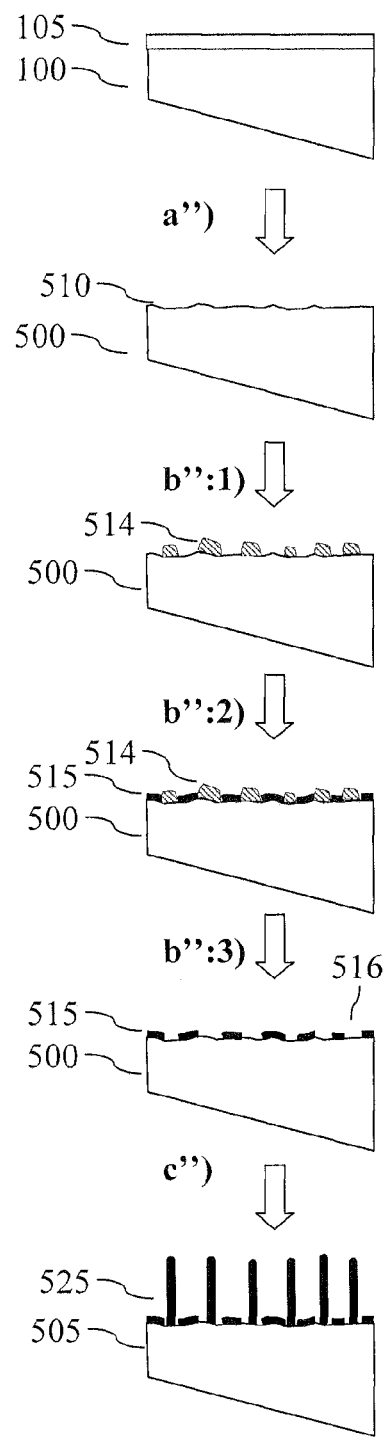
FIG. 5 is a schematic illustration of the steps according to the method of the invention using a thin organic film in forming an oxide template.

The method of producing epitaxial nanowires on a Si substrate, according to the embodiment, illustrated in the flowchart of FIG. 4 and in the schematic illustration of FIG. 5, comprises the following main steps:

a"): Hydrogen termination of the substrate surface, for example by etching in hydrofluoric acid, HF. The HF etching removes oxides 505 from the surface of the Si(111) substrate 500 and provides a substrate with a temporarily passivated surface 510. Preferably a HF etching procedure is utilised that produces a Si surface exhibiting at least some roughness. Procedures for controlling the roughness of the passivated surface of an Si(111) substrate depend on the pH of the HF-solution, and are well known in the art, see for example "*Ideal Hydrogen Termination of the Si-(111) Surface*" by Higashi, G. S. et al, Applied Physics Letters 56, 656-658 (1990). It should be noted that roughness in this context is on an atomic scale, the roughness achieved with the referred process is in the order of 0.3 nm. It should also be noted that the term roughness also refers to a less stable, less ideal, hydrogen termination of the substrate surface, which makes it more prone to oxidation.

b":1) Applying a thin semi-permeable film of an organic compound on the substrate surface. The thin film may be applied by, for example, spin coating, vaporisation, and dipping. The thin film typically leaves a plurality of residues 514 on the substrate surface, either by a self-assembling process or by a patterning process.

b":2) Providing a nucleation onset period. During this period a plurality of separated nucleation onset positions 516 are formed on the surface of the substrate. The density of the nucleation onset positions as well as the size of the individual nucleation onset positions are dependent on a combination of the thin organic film characteristics and the conditions during the nucleation onset period. An oxidation of the substrate surface 510 occurs during the nucleation onset period. The oxidation is guided by the thin organic film, or residues thereof. The procedure results in an oxide template 515 defining a plurality of nucleation onset positions 516, there the structure of the oxide template has a correlation to the structure of the thin organic film, or the organic residues of the film.

c"): Growth of nanowires, wherein epitaxially grown, vertically standing nanowires (125) are formed on the substrate surface on at least a part of the nucleation onset positions.

According to one embodiment of the invention the organic thin film, applied in step b":1, forms localised residues 514 on the substrate surface 510. The residues may form directly after the application of the thin organic film, or during the nucleation onset period due to changes of the film such as cracking or uneven evaporation. During the nucleation onset period, step b":2, substances present in the environment may penetrate weakenings in the film, or has direct access to the surface in areas not covered by the localised residues. In an oxidising environment, for example humid air, localised oxidation will occur in areas wherein the thin film is thin enough, or absent. According to the embodiment the substrate and the thin organic film is exposed to an oxidising environment. An oxidising environment can be provided in many ways—a simple approach is to use the humidity in air, whereby the expected reactions would be:

$$Si + H_2O \rightarrow SiO + H_2 \qquad (i)$$

$$SiO + H_2O \rightarrow SiO_2 + H_2 \qquad (ii)$$

If terminated after a proper time period, see below, $SiO_2$ will cover the substrate surface, except in areas covered by organic residues 514, and forms the oxide template 515. The areas covered with organic residue 514 is either un-oxidised or has a lower oxidation state, for example SiO, and will form the nucleation onset positions. The density of nanowires grown in subsequent steps has been found to be strongly dependent on the exposure time to ambient air between applying the organic thin film onto the substrate, and loading it into the reactor cell, wherein the growth step c" is performed. According to one embodiment of the invention this effect is used to control the nanowire density by performing controlled oxidations.

A rougher substrate surface will accentuate the formation of localised residues or localised weakenings in the organic film. Therefore, in this embodiment, a process in step a"), providing a relatively rough Si(111) surface may be advantageous.

A further optional substep, to be taken before the nanowire growth, according to the embodiment comprises:

b":3) Vaporization/baking of organic residues. The procedure will depend on the organic material chosen. For allyl alcohol a short heat treatment at 625° C. is sufficient to remove practically all organic residues.

According to a further embodiment of the invention the thin film is arranged to leave residues during the pre-heating. The residues acting as catalyst particles in the subsequent growth of nanowires. The residues can be of various constitutions, depending on the organic thin film. The thin organic film can initiate the formation of carbides, SiC, on the substrate surface. Alternatively the residues alter the surface, which gives a localized increased probability of nucleation. Also in this embodiment the forming of areas of increased permeability, for example due to an uneven evaporation, or cracking, of the thin organic film is utilised to form essentially randomly distributed residues, which in turn provides the nucleation onset positions. The process is preferably performed in the same chamber as growth phase take place.

According to another embodiment the thin organic film is used to passivate parts of the Si surface and nucleation onset positions will be provided in the openings of the film. The process could be compared to providing a mask of an organic compound and lithographically, for example, form holes in the mask. However, in the process according to this embodiment of the present invention, the properties of the thin organic film in combination with providing a suitable environment, "holes" are formed spontaneously as a result of the cracking or uneven evaporation of the organic thin film. Thus, the process of lithographically providing holes could be avoided.

According to yet another embodiment a thin organic film comprising oxidation substance or oxidation substance present on the surface is utilised in the forming of nucleation onset positions.

For the epitaxial growing of III-V semiconductor nanowires, growth step c, c', and c", methods are known in the art. For the growth process low pressure metal organic vapor phase epitaxy (LP-MOVPE) is suitable. Other possible techniques include, but is not limited to MOVPE, Molecular Beam Epitaxy (MBE) and Chemical Beam Epitaxy (CBE). Details in a form of a non-limiting example will be given below.

The nanowiskers have been exemplified with InAs. Also other semiconductors, in particular III-V semiconductors such as InP and GaP could advantageously be grown with the method according to the invention. Required modifications, for examples in the LP-MOVPE process, are obvious to the skilled persons.

In addition to the above mentioned organic compounds, suitable for use for the thin organic film 515, a large plurality of other organic compounds can be used. The selection dependent on the method of applying the film available, for example by spin coating, and preferred timescales and conditions of the nucleation onset period. Suitable organic compounds include, but is not limited to, allyl alcohol, n-decane, and acetone.

Examples of Preparations According to the Method of the Invention

Si(111) substrates were used. The wafer was diced and the samples cleaned in an ultrasonic bath. To remove organic residues the samples were subjected to an UV+ozone clean. The samples were then etched for 30 s in 4% aqueous hydrofluoric acid and removed without rinsing.

Allyl alcohol (2-propen-1-ol) from Sigma-Aldrich (purity 99+%) was spun coated at ≈6000 rpm for 30 s resulting in a ≈20 Å thick layer as measured by ellipsometer. The samples were then transferred to an inert atmosphere without further delay.

In an alternative process, n-decane was used as the organic substance in the same manner. However, after spinning the sample was kept in a humid atmosphere for approx. 10 min period before transfer to an inert atmosphere.

A low-pressure, 100 mbar, MOVPE system was used with TMI and arsine as precursor gases. A constant hydrogen carrier gas flow of 6 l/min was used. A 10 min anneal at 625° C. was performed to improve the quality of the growth. The temperature was then ramped down to a typical growth temperature of 550° C. Growth was initiated when the two precursors were simultaneously introduced in the growth cell. For the precursors typical molar fractions of $2 \times 10^{-6}$ for TMI and $2 \times 10^{-4}$ for $AsH_3$ were used. After a growth time of typically a few minutes the growth was halted by switching the TMI off. Cooling to room temperature was done under a protecting arsine flow.

Figure 6C:
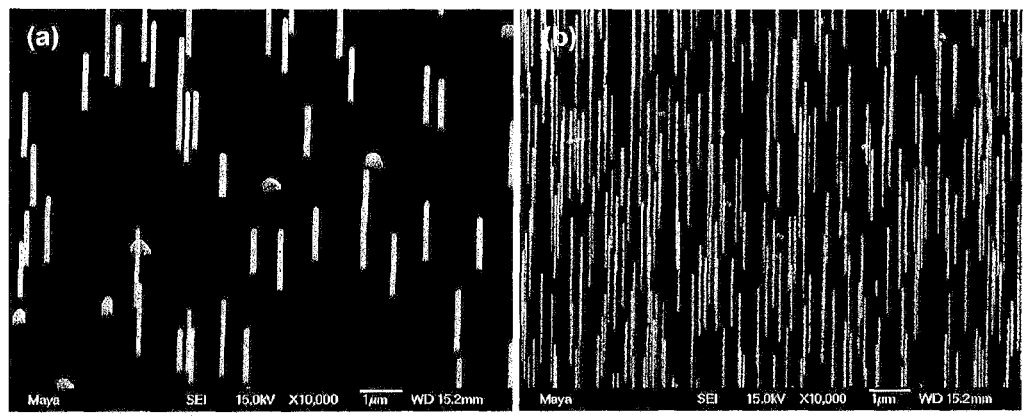
Figure 6C:
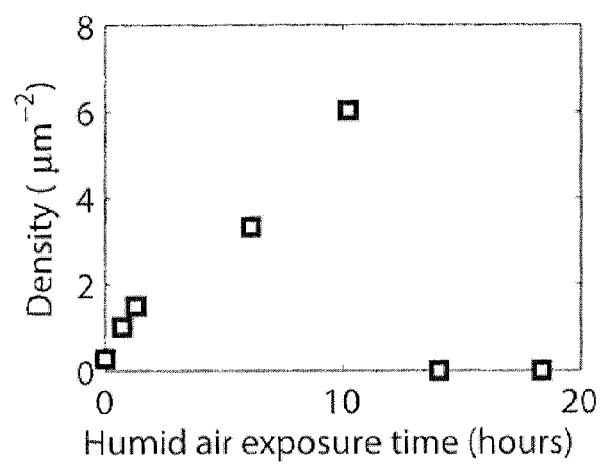

FIG. 6a-b Illustrates the effect of the nucleation onset period. In (a) n-decane was spun and the sample directly transported to the growth apparatus. In (b) the sample was spun with n-decane and stored in humid air for approx. 10 min. The viewing angle is 45 degrees with respect to the substrate normal. As described above the time of exposure of the coated substrate to an oxidising environment can be used to control the nanowire density, this is further illustrated in FIG. 6c, wherein the nanowire density is a function of exposure time. The conditions were stable around 22-24° C. and 85-90% relative humidity. Whereas the 6 h sample still shows nearly ideal NW growth, the 10 h sample exhibits an increased amount of non-epitaxial wires and competing island growth. Further oxidation (≥14 h under the above conditions) results in zero density, i.e. no growth.

FIG. 7a-d illustrates InAs nanowires grown according to the method of the invention using the organic compounds: a) allyl alcohol, b) n-decane, c) acetone, d) ethanol. The viewing angle is 45 degrees with respect to the substrate normal. It should be noted that in the figures the nanowires appearing to having an angle to the substrate is an effect of the imaging process. In reality the nanowires are epitaxial and vertically standing on the surface of the substrate.

In FIG. 8a-b the effect of the optional pre-heating or annealing is illustrated. In (a) no pre-heating was performed prior to the growth phase. The substrate illustrated in (b) were annealed at 625° C. for 10 minutes. The annealed substrate shows an increased growth quality.

The results indicated above supports the view of an inhomogeneously oxidized Si surface, where the oxidation of the H-terminated surface has been locally inhibited by organic coverage to form less oxidized patches surrounded by a growth-inhibiting mask of $SiO_2$. The organic residues are expected to be fully evaporated at the high temperature (625° C.) used in the annealing step before growth, leaving just the oxide template. Such a template much resembles the partially masked substrates used in selective area epitaxy. The decrease of nanowire density after long oxidation times can be understood: eventually the whole surface will be completely covered with a growth-inhibiting mask of $SiO_2$. It is noted that the air exposure necessary to reach a certain nanowire density depends strongly on the organic compound used. The shorter time required for allyl-alcohol compared to n-decane is consistent with the fact that allyl-alcohol is hygroscopic, attracting moisture which should increase the oxidation rate, whereas n-decane is hydrophobic.

The above procedure including a thin organic layer in the formation of the oxide template can be combined with modern nanolithography techniques such as micro-contact printing wherein a mask of organic material is transferred from a stamp to the substrate. Also techniques using scanning tunnelling microscopy such as dip-pen lithography can be used to give the organic thin film a pre-determined pattern, and hence the oxide template a corresponding pre-determined pattern.

The basic steps of the method according to the invention can readily be implemented in an industrial production system. One approach is to perform all the steps of the method in the same chamber, or at least in the same system, in order to avoid uncontrolled exposure to air, humidity etc. The steps of the method could in this case be modified according to:

i: Introducing one or a plurality of substrate in a vacuum chamber.
ii: Hydrogen termination by the use of atomic hydrogen, for example heating the substrate(s) and exposure to hydrogen plasma. The voltage and the plasma composition can be used to determine surface roughness.
ii: Evaporation or spraying of a thin organic film on the substrate(s).
iv: Exposure to oxidizing substance. Temperature could preferably be controlled for a better defined process.
v: Growth of nanowires, utilizing the same vacuum chamber, or after transfer to a growth chamber in the same system.

This modified process is well suited to combined with various patterning techniques.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A method of producing nanostructured devices comprising nanowires epitaxially grown over a surface of a substrate, the method comprising the steps of:
   providing an oxide template on the surface of the substrate, wherein the oxide template forms a nanowire nucleation catalyst layer of SiOx, wherein x≈1;
   growing the nanowires on the SiOx oxide template on the surface of the substrate, and
   hydrogen termination of the surface of the substrate in order to temporarily passivate the surface;
   wherein the step of providing an oxide template comprises a pre-treatment prior to the step of growing nanowires comprising the steps of:
   applying a thin organic film on the substrate surface; and
   providing a nucleation onset period, wherein the conditions as regards to time and environment are controlled so that a partial oxidation of the surface of the substrate occurs, the partial oxidation guided at least partly by the applied thin organic film giving a correlation between the structure of the oxide template and the thin organic film.

2. The method according to claim 1, wherein the oxide template is self-assembled.

3. The method according to claim 1, further comprising the step of patterning to form the oxide template.

4. The method according to claim 1, wherein a plurality of localized areas with increased permeability or cracks are formed in the thin organic film and a localized oxidation on the surface of the substrate occurs at the areas with increased permeability or at the cracks.

5. The method according to claim 1, wherein the nucleation onset period comprises exposing the substrate to humidity or oxidizing substances.

6. The method according to claim 1, wherein the nanowires comprise semiconductor nanowires and wherein the step of providing an oxide template comprises forming of $SiO_x$ clusters, wherein x≈1, on the surface of the substrate, the $SiO_x$ clusters to act as catalyst particles in the subsequent step of growing nanowires.

* * * * *